(12) United States Patent
Agarwala et al.

(10) Patent No.: US 7,224,063 B2
(45) Date of Patent: May 29, 2007

(54) DUAL-DAMASCENE METALLIZATION INTERCONNECTION

(75) Inventors: Birendra N. Agarwala, Hopewell Junction, NY (US); Eric M. Coker, Burlington, VT (US); Anthony Correale, Jr., Raleigh, NC (US); Hazara S. Rathore, Stormville, NY (US); Timothy D. Sullivan, Underhill, VT (US); Richard A. Wachnik, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 1103 days.

(21) Appl. No.: 09/871,883

(22) Filed: Jun. 1, 2001

(65) Prior Publication Data

US 2002/0182855 A1    Dec. 5, 2002

(51) Int. Cl.
H01L 23/52 (2006.01)
(52) U.S. Cl. ............... 257/758; 257/753; 257/767; 257/773; 257/E23.142; 257/E23.145
(58) Field of Classification Search ........... 257/753, 257/758, 767, 771, 773, 774, E23.142, E23.145
See application file for complete search history.

(56) References Cited

U.S. PATENT DOCUMENTS

| | | | |
|---|---|---|---|
| 5,635,423 A | 6/1997 | Huang et al. | |
| 5,841,195 A | 11/1998 | Lin et al. | |
| 5,973,348 A | 10/1999 | Ishibashi | |
| 5,981,378 A | 11/1999 | Bothra | |
| 5,989,623 A | 11/1999 | Chen et al. | |
| 5,990,011 A * | 11/1999 | McTeer | 216/38 |
| 6,034,436 A | 3/2000 | Iwasaki | |
| 6,156,651 A * | 12/2000 | Havemann | 438/626 |
| 6,221,780 B1 | 4/2001 | Greco et al. | |
| 6,265,779 B1 * | 7/2001 | Grill et al. | 257/759 |
| 6,362,528 B2 * | 3/2002 | Anand | 257/758 |
| 6,373,136 B2 * | 4/2002 | Otsuka et al. | 257/758 |
| 6,376,370 B1 * | 4/2002 | Farrar | 257/762 |
| 6,380,084 B1 * | 4/2002 | Lim et al. | 438/622 |

FOREIGN PATENT DOCUMENTS

| | | |
|---|---|---|
| EP | 0710981 | 5/1996 |
| EP | 0845808 | 6/1998 |
| EP | 0987752 | 3/2000 |
| JP | 2002-016138 A * | 1/2002 |

OTHER PUBLICATIONS

Patent Abstracts of Japan, vol. 1998, No. 03, Feb. 27, 1998, JP 09 306989 A, 1 page, Yamagishi Nobuhisa.

* cited by examiner

*Primary Examiner*—Kenneth Parker
*Assistant Examiner*—Matthew E. Warren
(74) *Attorney, Agent, or Firm*—Schmeiser, Olsen & Watts; William D. Sabo

(57) ABSTRACT

An interconnect structure, comprising: a lower level wire having a side and a bottom, the lower level wire comprising: a lower core conductor and a lower conductive liner, the lower conductive liner on the side and the bottom of the lower level wire; an upper level wire having a side and a bottom, the upper level wire comprising an upper core conductor and an upper conductive liner, the upper conductive liner on the side and the bottom of the upper level wire; and the upper conductive liner in contact with the lower core conductor and also in contact with the lower conductive liner in a liner-to-liner contact region.

6 Claims, 17 Drawing Sheets

DUAL-DAMASCENE METALLIZATION INTERCONNECTION

FIELD OF THE INVENTION

The present invention relates to the field of semiconductor devices; more specifically, it relates to a dual damascene via interconnect structure in a dielectric layer and method for forming the structure.

BACKGROUND OF THE INVENTION

FIG. 1 is a partial top view of a related art dual damascene via interconnect. In FIG. 1, a lower level wire 100 is electrically connected to an upper level wire 105 by a via 110. Lower level wire 100 is comprised of a conductive liner 115 and a core conductor 120. Upper level wire 105 is comprised of a conductive liner 125 and a core conductor 130. Via 105 is integrally formed with upper level wire 105 and comprises conductive liner 125 and core conductor 130. Via 110 is aligned distances "d1" and "d2" from sides 135 of upper wire 105. The two distances, "d1" and "d2" may or may not be equal. Via 110 is aligned with distances "d3" and "d4" from sides 140 of lower wire 100. The two distances, "d3" and "d4" may or may not be equal. The thickness of conductive liner 115 is less than distances "d3" and "d4." and the thickness of conductive liner 125 is less than distances "d1" and "d2."

Lower level wire 100 is formed by a damascene process or a dual damascene process. In a damascene process, a trench is formed in a dielectric layer, for example, by reactive ion etching (RIE) of the dielectric layer, and liner and core conductors deposited, filling the trench. The liner is generally deposited conformally as a thin layer, coating the bottom and sides of the trench. The core conductor may be deposited by any suitable method known to the industry, including, but not limited to, physical vapor deposition, chemical vapor deposition and plating, until the trench is filled. A chemical-mechanical-polish process (CMP) is performed to remove excess metal and planarize the top of the metal filled trench with the top surface of the dielectric. Upper level wire 105 and via 110 are formed by a dual-damascene process. In a dual damascene process, a trench for the wire is first etched part way into a dielectric layer. Next via openings are etched in the bottom of the trench through the remaining dielectric to expose an underlying wire or electrical contact to a semiconductor device. Of course, the via openings may be etched first, followed by etching of the trench. Liner and core conductors are then deposited and a CMP process performed as for a damascene process. In a dual damascene process, the liner also coats the sides and bottom of the via openings as well as the bottom and sides of the trench. Lower level wire 100 may be formed by a dual damascene process as well.

FIG. 2A is a partial cross-section view through 2-2 of FIG. 1. In FIG. 2A, a lower dielectric layer 145 is formed on a semiconductor substrate 150. Lower level wire 100 is formed in a lower dielectric layer 145. Formed on top of lower dielectric layer 145 and lower level wire 100 is an upper dielectric layer 155. Upper level wire 105 and via 110 are formed in upper dielectric layer 155. Conductive liner 125 covers a bottom 160 of upper wire 105 and a sidewall 165 and a bottom 170 of via 110. Conductive liner 115 covers sidewall 175 and a bottom 180 of lower level wire 100. Via 105 is embedded a distance "d5" into core conductor 120 of lower level wire 100.

Referring to FIG. 1 and FIG. 2A, a ring 185 of core conductor 120 of lower level wire 100 is in contact with upper dielectric layer 155. Conductive liner 125 is not in electrical contact with conductive liner 115. The electrical path from upper level wire 105 to lower wire 100 consists of core conductor 130 to conductive liner 125 and from the conductive liner to core conductor 120.

In one example, core conductors 120 and 130 are copper and conductive liners 115 and 125 comprise a dual tantalum nitride/tantalum layers (the tantalum nitride being the outer layer.) The tantalum nitride layer acts, as an adhesion layer and as a copper migration barrier, while the tantalum layer is a relatively good conductive layer. In another example, core conductors 120 and 130 are aluminum or aluminum alloys such as aluminum/copper or aluminum/copper/silicon and conductive liners 115 and 125 comprise dual titanium nitride/titanium layers (the titanium nitride being the outer layer) or a tungsten layer. Of course, any of the core conductor materials listed above may be used in combination with any of the conductive liner materials listed above.

A problem with the afore-mentioned copper and aluminum metallurgies is a phenomenon called electro-migration. In electro-migration, core conductor atoms (copper or aluminum) are driven in the direction of electron flow. In the case of a via contacting a lower wire and for electron flow from the via to the lower wire, the core conductor atoms of the lower wire are driven away from the via leaving behind a void.

FIG. 2B is a partial cross-section view through 2-2 of FIG. 1 illustrating electro-migration voiding. In FIG. 2B, a void 190 has been formed by electro-migration. Core conductor 120 is not contacting liner 125 and consequentially, there is no electrical contact between upper level wire 105 (through via 110) and lower wire level 100.

Clearly, in the case of a via contacting a lower wire, the lower wire being wider than the contacting via, the potential for catastrophic open circuit failures exist. To fully realize the full benefit of copper (or aluminum) dual damascene technology a method of ensuring electrical connection between the via and the lower wire even when very large or even catastrophic core conductor voiding occurs is required.

SUMMARY OF THE INVENTION

A first aspect of the present invention is an interconnect structure, comprising: a lower level wire having a side and a bottom, the lower level wire comprising: a lower core conductor and a lower conductive liner, the lower conductive liner on the side and the bottom of the lower level wire; an upper level wire having a side and a bottom, the upper level wire comprising an upper core conductor and an upper conductive liner, the upper conductive liner on the side and the bottom of the upper level wire; and the upper conductive liner in contact with the lower core conductor and also in contact with the lower conductive liner in a liner-to-liner contact region.

A second aspect of the present invention is an interconnect structure, comprising: a lower level wire having a side and a bottom, the lower level wire comprising a lower core conductor and an lower conductive liner, the lower conductive liner on the side and the bottom of the lower level wire; an upper level wire having a side and a bottom and a via integrally formed in the bottom of the upper level wire, the via have a side and a bottom, the upper level wire and the via each comprising an upper core conductor and an upper conductive liner, the upper conductive liner on the side and the bottom of the upper level wire and on the side and bottom of the via; and the upper conductive liner on the bottom of the via in contact with the lower core conductor and also in contact with the lower conductive liner in a liner-to-liner contact region.

A third aspect of the present invention is an interconnect structure, comprising: a lower level wire having a side and a bottom, the lower level wire comprising a lower core conductor and an lower conductive liner, the lower conductive liner on the side and the bottom of the lower level wire; an upper level wire having a side and a bottom and an array of vias integrally formed in the bottom of the upper level wire, each via of the array of vias having a side and a bottom, the upper level wire and each via comprising an upper core conductor and an upper conductive liner, the upper conductive liner on the side and the bottom of the upper level wire and on the side and bottom of each via; and the upper conductive liner on the bottom of each via of a first portion of the array of vias in contact with the lower core conductor and each via of a second portion of the array of vias in contact with the lower core conductor and also in contact with the lower conductive liner in liner-to-liner contact regions.

A fourth aspect of the present invention is an interconnect structure, comprising: a lower level wire having a side and a bottom and one or more integral extensions each extension having a side and a bottom, the lower level wire and extensions comprising a lower core conductor and an lower conductive liner, the lower conductive liner on the side and the bottom of the lower level wire and the extensions; an upper level wire having a side and a bottom and an array of vias integrally formed in the bottom of the upper level wire, each via of the array of vias having a side and a bottom, the upper level wire and each via comprising an upper core conductor and an upper conductive liner, the upper conductive liner on the side and the bottom of the upper level wire and on the side and bottom of each via; and the upper conductive liner on the bottom of each via of a first portion of the array of vias in contact with the lower core conductor of the lower level wire and a second portion of the array of vias in contact with the lower core conductor of the extensions and also in contact with the lower conductive liner of the extensions in liner-to-liner contact regions.

A fifth aspect of the present invention is an interconnect structure, comprising: a lower level wire having a side and a bottom, the lower level wire comprising a lower core conductor and a lower conductive liner, the lower conductive liner on the side and the bottom of the lower level wire; one or more dielectric pillars formed in the lower level wire, the lower conductive liner on sides of the dielectric pillars; an upper level wire having a side and a bottom, the upper level wire comprising an upper core conductor and an upper conductive liner, the upper conductive liner on the side and the bottom of the upper level wire; and the upper conductive liner in contact with the lower core conductor and also in contact with the lower conductive liner on the sides of the dielectric pillars in liner-to-liner contact regions.

A sixth aspect of the present invention is an interconnect structure, comprising: a lower level wire having a side and a bottom, the lower level wire comprising a lower core conductor and an lower conductive liner, the lower conductive liner on the side and the bottom of the lower level wire; one or more dielectric pillars formed in the lower level wire, the lower conductive liner on sides of the dielectric pillars; an upper level wire having a side and a bottom and one or more vias integrally formed in the bottom of the upper level wire, each via having a side and a bottom, the upper level wire and each via comprising an upper core conductor and an upper conductive liner, the upper conductive liner on the side and the bottom of the upper level wire and on the side and bottom of each via; and the upper conductive liner on the bottom of at least a portion of the one or more vias in contact with the lower core conductor and at least a portion of the one or more vias in contact with the lower conductive liner on the side of at least a portion of the one or more dielectric pillars in liner-to-liner contact regions.

A seventh aspect of the present invention is a method of fabricating an interconnect structure, comprising: providing a substrate; forming, on the substrate, a lower level wire having a side and a bottom, the lower level wire comprising a lower core conductor and a lower conductive liner, the lower conductive liner formed on the side and the bottom of the lower level wire; forming an upper level wire having a side and a bottom, the upper level wire comprising an upper core conductor and an upper conductive liner, the upper conductive liner formed on the side and the bottom of the upper level wire; and aligning the lower level wire with the upper level wire such that the upper conductive liner contacts the lower core conductor and also contacts the lower conductive liner to form a liner-to-liner contact region.

An eighth aspect of the present invention is a method of fabricating an interconnect structure, comprising: providing a substrate; forming, on the substrate, a lower level wire having a side and a bottom, the lower level wire comprising a lower core conductor and an lower conductive liner, the lower conductive liner formed on the side and the bottom of the lower level wire in a lower dielectric layer; forming an upper level wire having a side and a bottom and a via integrally formed in the bottom of the upper level wire, the via having a side and a bottom, the upper level wire and the via each comprising an upper core conductor and an upper conductive liner, the upper conductive liner formed on the side and the bottom of the upper level wire and on the side and bottom of the via; and aligning upper level wire with the lower level wire such that the upper conductive liner on the bottom of the via contacts the lower core conductor and also contacts the lower conductive liner to form a liner-to-liner contact region.

A ninth aspect of the present invention is a method of forming an interconnect structure, comprising: providing a substrate; forming, on the substrate, a lower level wire having a side and a bottom, the lower level wire comprising a lower core conductor and a lower conductive liner, the lower conductive liner formed on the side and the bottom of the lower level wire; forming one or more dielectric pillars in the lower level wire, the lower conductive liner formed on sides of the dielectric pillars; forming an upper level wire having a side and a bottom, the upper level wire comprising an upper core conductor and an upper conductive liner, the upper conductive liner formed on the side and the bottom of the upper level wire; and aligning the upper level wire with the lower level wire such that the upper conductive liner contacts the lower core conductor and also contacts the lower conductive liner on the sides of the dielectric pillars to form liner-to-liner contact regions.

A tenth aspect of the present invention is a method of fabricating an interconnect structure, comprising: providing a substrate; forming, on the substrate, a lower level wire having a side and a bottom, the lower level wire comprising a lower core conductor and an lower conductive liner, the lower conductive liner formed on the side and the bottom of the lower level wire; forming one or more dielectric pillars in the lower level wire, the lower conductive liner formed on sides of the dielectric pillars; forming an upper level wire having a side and a bottom and one or more vias integrally formed in the bottom of the upper level wire, each via having a side and a bottom, the upper level wire and each via comprising an upper core conductor and an upper conductive liner, the upper conductive liner formed on the side and the bottom of the upper level wire and on the side and bottom of each via; and aligning the upper level wire to the lower level wire such that the upper conductive liner on the bottom of at least a portion of the one or more vias contacts the lower core conductor and at least a portion of the one or more vias contacts the lower conductive liner on the side of at least a portion of the one or more dielectric pillars to form liner-to-liner contact regions

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
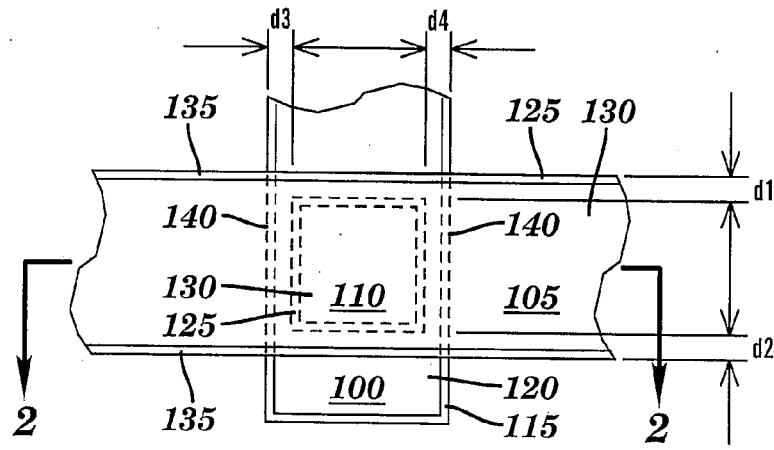
FIG. 1 is a partial top view of a related art dual damascene via interconnect.
Figure 2A:
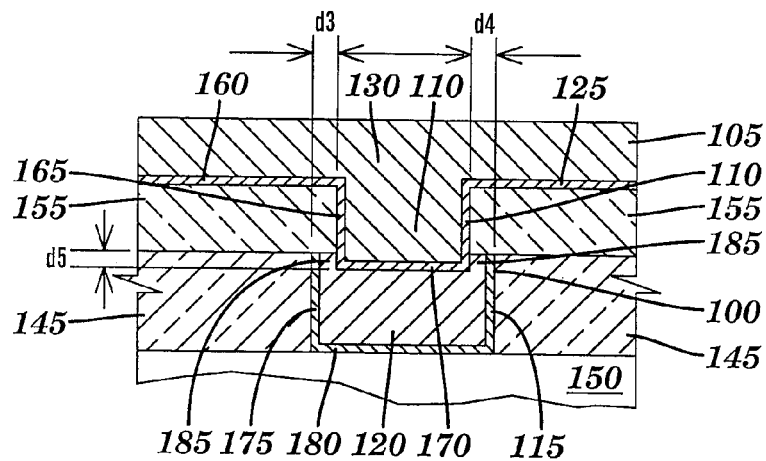
FIG. 2A is a partial cross-section view through 2-2 of FIG. 1.
Figure 2B:
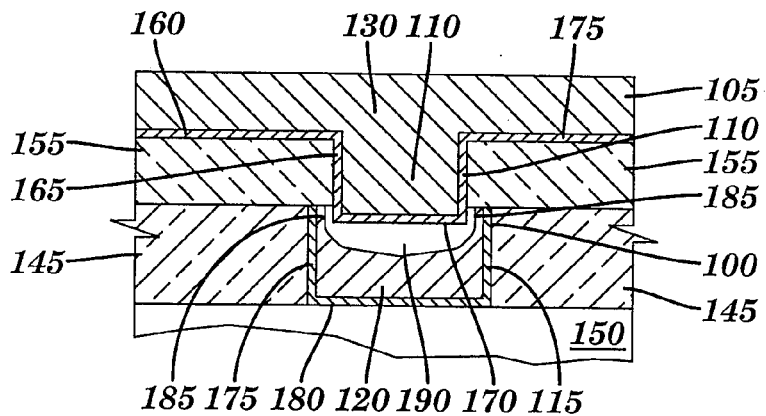
FIG. 2B is a partial cross-section view through 2-2 of FIG. 1 illustrating electro-migration voiding.
Figure 3:
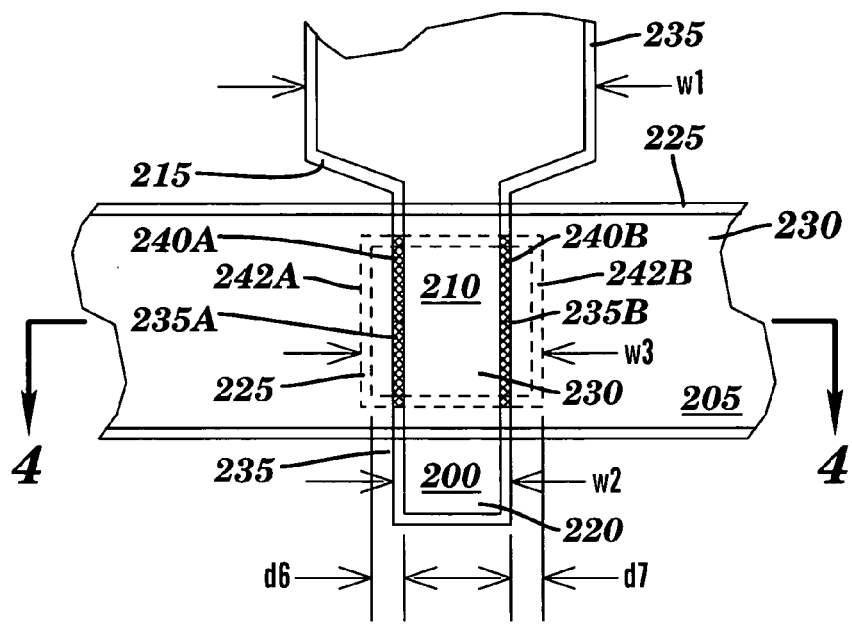
FIG. 3 is a partial top view of a dual damascene via interconnect according to a first embodiment of the present invention.

FIG. 3 is a partial top view of a dual damascene via interconnect according to a first embodiment of the present invention. In FIG. 3, a lower level wire 200 is electrically connected to an upper level wire 205 by a via 210. Lower level wire 200 is comprised of a conductive liner 215 and a core conductor 220. Upper level wire 205 is comprised of a conductive liner 225 and a core conductor 230. Via 210 is integrally formed with upper level wire 205 and comprises conductive liner 225 and core conductor 230. Conductive liner 215 is formed on side 235 of lower level wire 200. A side 242A of via 210 is aligned a distance "d6" from side portion 235A of side 235 of lower level wire 200. A side 242B of via 210 is aligned a distance "d7" from side portion 235B of side 235 of lower level wire 200. Where liner 215 passes under via 210 liner-to-liner contact regions 240A and 240B (cross-hatched) are defined, meaning conductive liner 215 of lower level wire 200 is in electrical contact with conductive liner 225 of upper level wire 205. Side portion 235A is co-extensive with contact region 240A and side portion 235B is co-extensive with contact region 240B. Lower level wire 200 has a width "w1" changing to a width "w2" where the lower level wire passes under upper level wire 205. In one example "w1" and "w2" are different in another example "w1" and "w2" are the same. Via 210 has a width "w3." By construction, w3=w2+d6+d7. Either or both distances "d6" and "d7" may be zero.

Lower level wire 200 is formed by a damascene process or dual damascene process as described above. Upper level wire 205 and via 210 are formed by a dual damascene process as described above.

In one example, "w1" is about 0.0250 to 1.0 micron, "w2" is about 0.0225 to 0.9 micron and "w3" is about 0.025 to 1.0 micron. Conductive liners 215 and 225 are about 25 Å to 1000 Å thick and comprise tantalum, tantalum nitride, titanium, titanium nitride, tungsten, tungsten nitride or combinations thereof. Core conductors 120 and 130 are copper, aluminum or aluminum alloys such as aluminum /copper or aluminum/copper/silicon.

Figure 4A:
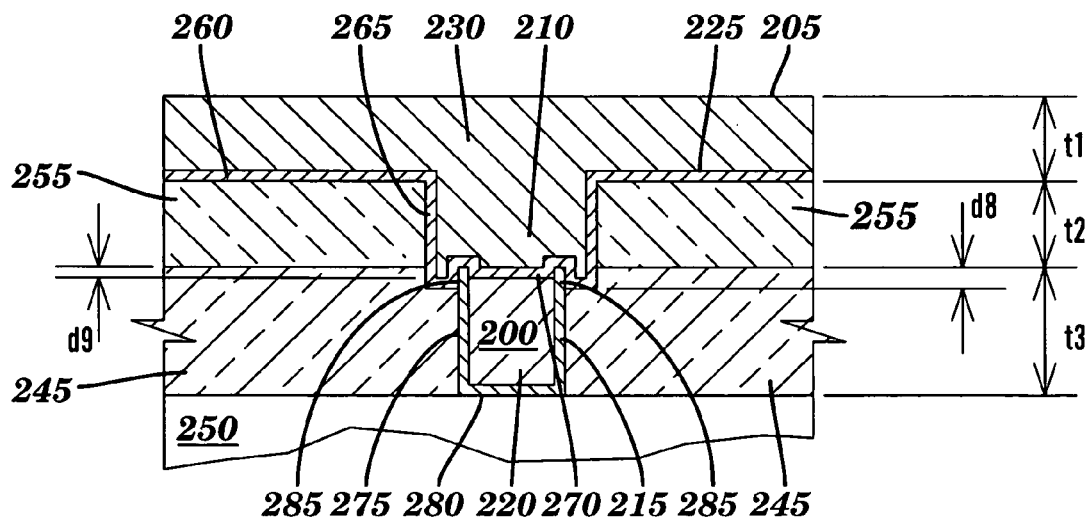
FIG. 4A is a partial cross-section view through 4-4 of FIG. 3.

FIG. 4A is a partial cross-section view through 4-4 of FIG. 3. In FIG. 4A, a lower dielectric layer 245 is formed on a semiconductor substrate 250. Lower wire 200 is formed in lower dielectric layer 245. Formed on top of a lower dielectric layer 245 and lower wire 200 is an upper dielectric layer 255. Upper wire 205 and via 210 are formed in an upper dielectric layer 255. Via 210 is embedded a depth "d9" into core conductor 220 of lower level wire 200. Via 210 is embedded a depth "d8" into lower dielectric layer 245. Upper level wire 205 is "t1" thick. Via 210 is "t2" thick and lower level wire 200 is "t3" thick. Conductive liner 225 covers a bottom 260 of upper wire 205 and sidewall 265 and a bottom 270 of via 110. Conductive liner 215 covers a sidewall 275 and a bottom 280 of lower level wire 200. Conductive liner 225, of upper level wire 205, also covers upper edges 285 of conductive liner 215 of lower wire 210.

In one example, "t1" is about 0.025 to 1.25 micron, "t2" is about 0.025 to 1.25 micron and "t3" is about 0.025 to 1.25 micron, "d8" is about 0 to "t3"/2 micron, and "d9" is about 0 to "t3"/10 micron. Examples of lower dielectric layer 245 and upper dielectric layer 255 may comprise silicon oxide, silicon nitride, diamond, fluorine doped silicon oxide, spin on glass, porous silicon oxide, polyimide, polyimide siloxane, polysilsequioxane polymer, benzocyclobutene, paralyene N, paralyene F, polyolefin, poly-naphthalene, amorphous Teflon, SILK™ (Dow Chemical, Midland, Mich.), black diamond (Applied Materials, Santa Clara, Calif.), polymer foam, aerogel, air, dielectric gases, a partial vacuum or combinations of layers thereof.

Figure 4B:
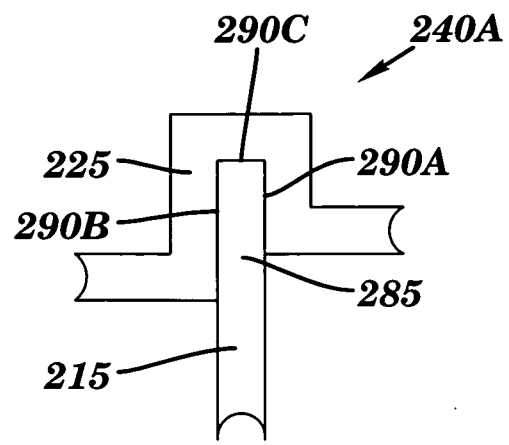
FIG. 4B is an enlarged view of one upper edge 285 of conductive liner 215 illustrated in FIG. 4B.

FIG. 4B is an enlarged view of upper edge 285 of conductive liner 215 illustrated in FIG. 4A. FIG. 4B should be considered as an exemplary case. In FIG. 4B, liner-to liner contact region 240A includes an inner surface 290A, an outer surface 290B and a top surface 290C of upper edge 285 of conductive liner 215. All liner-to-liner contact regions according to the present invention are so formed.

However, depending upon the amount of over-etch of the dielectric layer or core conductor when the via opening is formed in the dielectric layer either or both of inner and outer sides may not be exposed and thus not be included in a liner-to-liner contact region. Also, depending upon alignment, one side or the other, or even the top of the liner may not be positioned to be included in a liner-to-liner contact region.

Referring to FIG. 3 and FIG. 4A, the electrical path from upper level wire 205 to lower level wire 200 consists of a first path from core conductor 230 to conductive liner 225 and conductive liner 225 to core conductor 220 as well as a second path from core conductor 230 to conductive liner 225 to conductive liner 215 to core conductor 220.

Figure 4C:
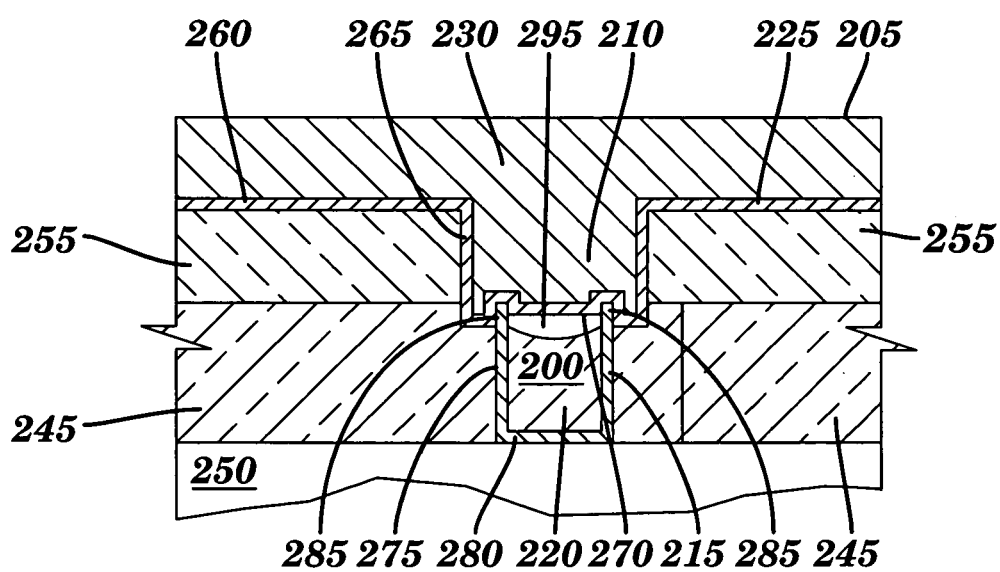
FIG. 4C is a partial cross-section view through 4-4 of FIG. 3 illustrating electro-migration voiding.

FIG. 4C is a partial cross-section view through 4-4 of FIG. 3 illustrating electro-migration voiding. In FIG. 4C, a void 295 has been formed by electro-migration. While conductive liner 225 is not contacting core conductor 220, conductive liner 220 is still contacting liner 225 and consequentially, there is still electrical contact between upper wire 205 (through via 210) and lower wire 200.

A second embodiment of the present invention differs from the first embodiment in that, in the second embodiment, only one liner-to-liner contact region (liner-to-liner contact region 240B) is defined by the passing of liner 215 under via 210. The examples of dimensions, materials and processes described for the first embodiment of the present invention are applicable to the second embodiment of the present invention as well.

Figure 5:
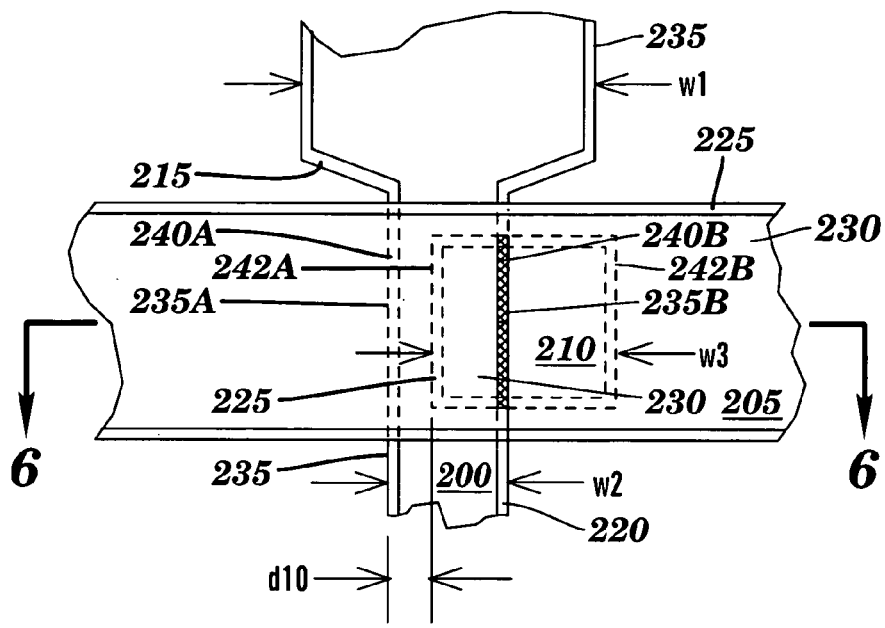
FIG. 5 is a partial top view of a dual damascene via interconnect according to a second embodiment of the present invention.

FIG. 5 is a partial top view of a dual damascene via interconnect according to the second embodiment of the present invention. In FIG. 5, lower level wire 200 is electrically connected to upper level wire 205 by via 210. Lower level wire 200 is comprised of conductive liner 215 and core conductor 220. Upper level wire 205 is comprised of conductive liner 225 and core conductor 230. Via 210 is integrally formed with upper level wire 205 and comprises conductive liner 225 and core conductor 230. Where liner 215 passes under via 210 liner-to-liner contact region 240B (cross-hatched) is defined. Side portion 235B is co-extensive with contact region 240B. Lower level wire 200 has a width "w1" changing to a width "w2" where the lower level wire passes under upper level wire 205. Via 210 has a width "w3." A side 242A of via 210 is aligned a distance "d10" from side portion 235A of side 235 of lower level wire 200. By construction, w3=w2+d10. Distance "d10" must be greater than the thickness of conductive liner 215.

Figure 6A:
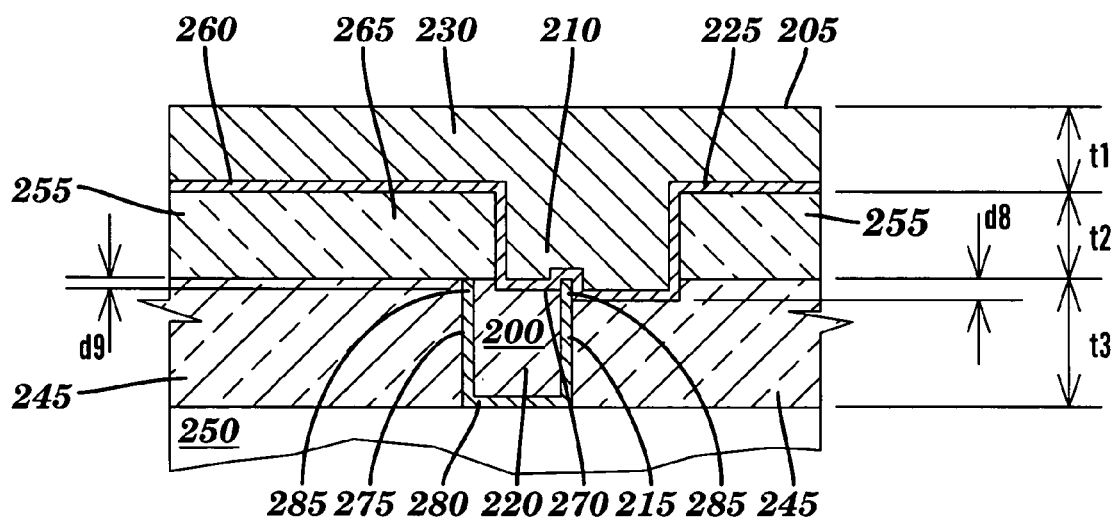
FIG. 6A is a partial cross-section view through 6-6 of FIG. 5.

FIG. 6A is a partial cross-section view through 6-6 of FIG. 5. In FIG. 6A, a lower dielectric layer 245 is formed on semiconductor substrate 250. Lower wire 200 is formed in lower dielectric layer 245. Formed on top of lower dielectric layer 245 and lower wire 200 is upper dielectric layer 255. Upper wire 205 and via 210 are formed in upper dielectric layer 255. Via 210 is embedded a depth "d9" into core conductor 220 of lower level wire 200. Via 210 is embedded a depth "d8" into lower dielectric layer 245. Upper level wire 205 is "t1" thick. Via 210 is "t2" thick and lower level wire 200 is "t3" thick. Conductive liner 225 covers bottom 260 of upper wire 205 and side 265 and bottom 270 of via 210. Conductive liner 215 covers sidewall 275 and bottom 280 of lower level wire 200. Conductive liner 225, of upper level wire 205, also covers upper edge 285 of conductive liner 215 of lower wire 210.

Referring to FIG. 5 and FIG. 6A, the electrical path from upper level wire 205 to lower level wire 200 consists of a first path from core conductor 230 to conductive liner 225 and conductive liner 225 to core conductor 220 as well as a second path from core conductor 230 to conductive liner 225 to conductive liner 215.

Figure 6B:
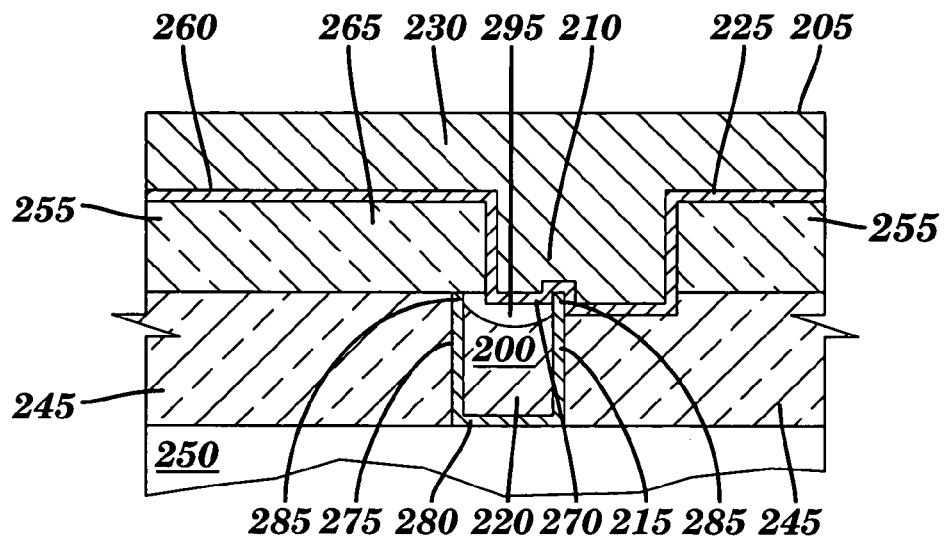
FIG. 6B is a partial cross-section view through 6-6 of FIG. 5 illustrating electro-migration voiding.

FIG. 6B is a partial cross-section view through 6-6 of FIG. 5 illustrating electro-migration voiding. In FIG. 6B, void 295 has been formed by electro-migration. While conductive liner 225 is not contacting core conductor 220, conductive liner 215 is still contacting liner 225 and consequentially, there is still electrical contact between upper wire 205 (through via 210) and lower wire 200.

A third embodiment of the present invention differs from the first embodiment in that, in the third embodiment, three liner-to-liner contact regions (240A, 240B and 240C) are defined by the passing of conductive liner 215 under via 210. The examples of dimensions, materials and processes described for the first and second embodiments of the present invention are applicable to the third embodiment of the present invention as well.

Figure 7:
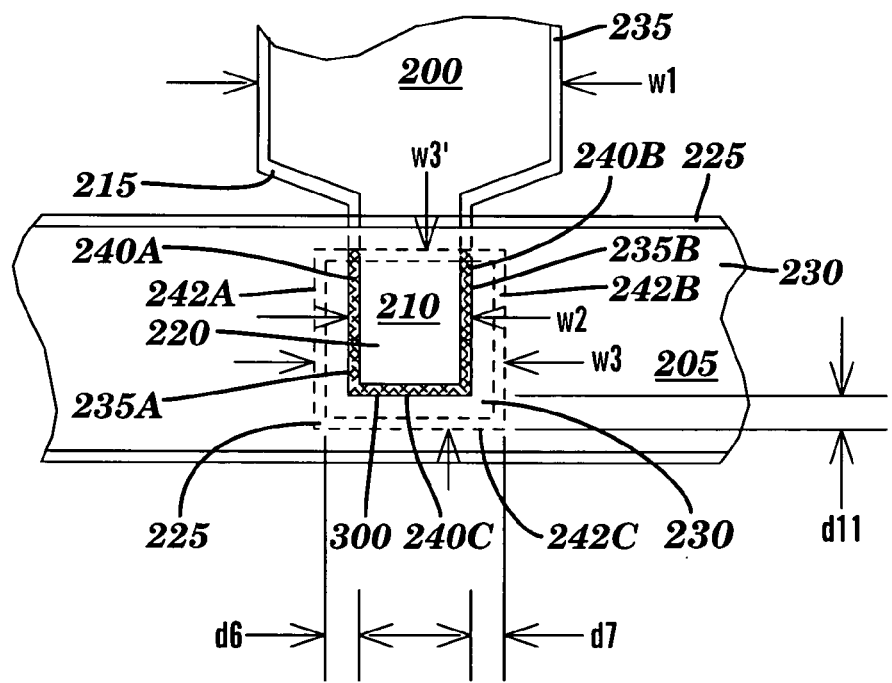
FIG. 7 is a partial top view of a dual damascene via interconnect according to a third embodiment of the present invention.

FIG. 7 is a partial top view of a dual damascene via interconnect according to a third embodiment of the present invention. In FIG. 7, lower level wire 200 is electrically connected to upper level wire 205 by via 210. Lower level wire 200 is comprised of conductive liner 215 and core conductor 220. Upper level wire 205 is comprised of conductive liner 225 and core conductor 230. Via 210 is integrally formed with upper level wire 205 and comprises conductive liner 225 and core conductor 230. Conductive liner 215 is formed on side 235 and an end 300 of lower wire 200. Side 242A of via 210 is aligned a distance "d6" from side portion 235A of side 235 of lower level wire 200. Side 242B of via 210 is aligned a distance "d7" from side portion 235B of side 235 of lower level wire 200. Where liner 215 passes under via 210 liner-to-liner contact regions 240A, 240B and 240C (cross-hatched) are defined, meaning conductive liner 215 of lower level wire 200 is in electrical contact with conductive liner 225 of upper level wire 205. Side portion 235A is co-extensive with contact region 240A, side portion 235B is co-extensive with side portion 235A and end 300 is co-extensive with contact region 240C. Lower level wire 200 has a width "w1" changing to a width "w2" where the lower level wire passes under upper level wire 205 or alternatively, the lower level wire can remain at width "w1". Via 210 has a width "w3." By construction, w3=w2+d6+d7. Either or both distances "d6" and "d7" may be zero. End 300 of lower level wire 200 is aligned distance "d11" from side 242C of via 210. Via 210 has a width "w3" and a length "w3'." Distance "d11" may be zero but cannot be greater than "w3'." In one example "w3'" is about 0.025 to 1.0 microns.

A fourth embodiment of the present invention differs from the previous embodiments in the component regions that make up the contact-to-contact region. The examples of dimensions, materials and processes described for the first, second and third embodiments of the present invention are applicable to the fourth embodiment of the present invention as well.

Figure 8:
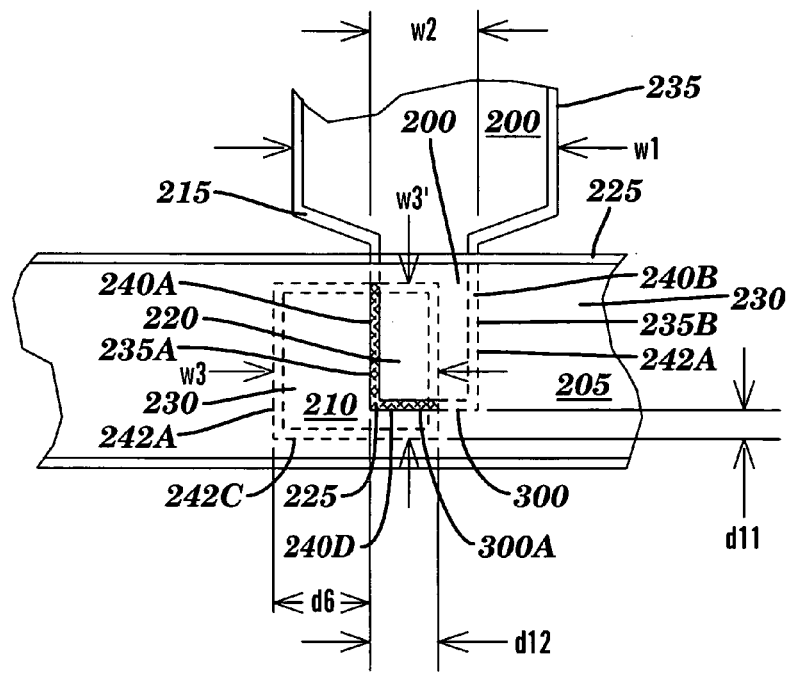
FIG. 8 is a partial top view of a dual damascene via interconnect according to a fourth embodiment of the present invention.

FIG. 8 is a partial top view of a dual damascene via interconnect according to a fourth embodiment of the present invention. In FIG. 8, lower level wire 200 is electrically connected to an upper level wire 205 by via 210. Lower level wire 200 is comprised of conductive liner 215 and core conductor 220. Upper level wire 205 is comprised of conductive liner 225 and core conductor 230. Via 210 is integrally formed with upper level wire 205 and comprises conductive liner 225 and core conductor 230. Side 242A of via 210 is aligned a distance "d6" from side portion 235A of side 235 of lower level wire 200 thus defining liner-to-liner contact region 240A in the same manner as illustrated in FIG. 3 and described above. Side portion 235A is co-extensive with contact region 240A. Via 210 is aligned distance "d12" from side portion 235B of side 235 of lower level wire 200. A portion 300A of end 300 of lower level wire 200 is positioned under via 210, defining a liner liner-to-liner contact region 240D. End portion 300A is co-extensive with contact region 240D. End 300 of lower level wire 200 is aligned distance "d11" from side 242C of via 210. Via 210 has a width "w3" and a length "w3'." Distance "d11" may be zero but cannot be greater than "w3'." Distance "d12" may be zero but can not be greater than "w3'."

In FIGS. 9 through 19, liner-to-liner contact regions are formed by one or more of the previously described embodiments of the present invention.

FIGS. 9 through 16 are partial top views of via interconnect schemes according to the present invention. In FIGS. 9 through 17 and 19 conductive liners 215 and 225 are not illustrated to simplify the drawings, but it should be understood, that the conductive liners exist as illustrated in the preceding drawings.

Figure 9:
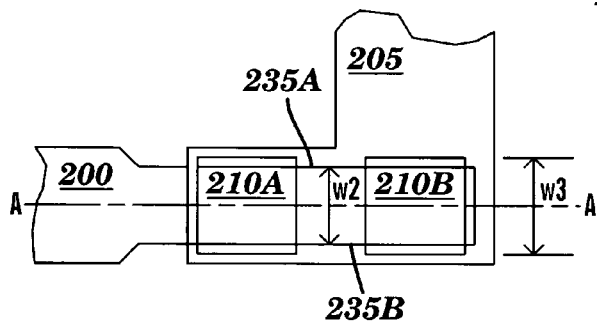
FIGS. 9 through 16 are partial top views of via interconnect schemes according to the present invention.

In FIG. 9, lower level wire 200 is electrically connected to upper level wire 205 by vias 210A and 210B. Vias 210A and 210B contact lower level wire 200 along longitudinal axis A-A of the lower level wire. Vias 210A and 210B overlap sides portions 235A and 235B of lower level wire 200. Lower level wire 200 has a width "w2" under vias 210A and 210B. Vias 210A and 210B have a width "w3." In one example, "w2" is about 0.0225 to 0.9 micron and "w3" is about 0.025 to 1.0 micron. While two vias have been illustrated, any number of vias may be laid out along longitudinal axis A-A.

Figure 10:
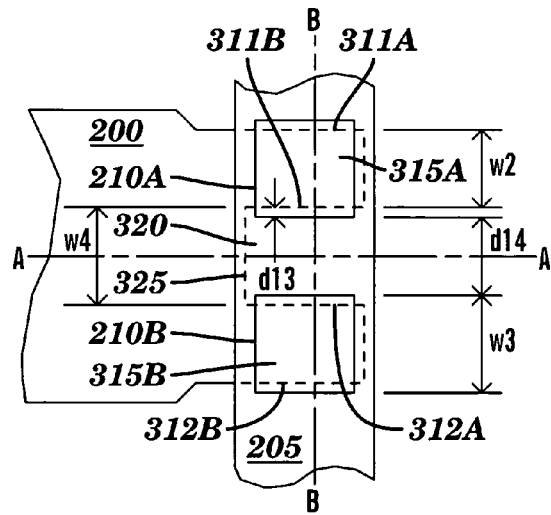

In FIG. 10, lower level wire 200 is electrically connected to upper level wire 205 by vias 210A and 210B. Via 210A overlaps sides 311A and 311B of extension 315A of lower level wire 200. Via 210B overlaps sides 312A and 312B of extension 315B of lower level wire 200. Extensions 315A and 315B extend from end 325 of lower level wire 200 and are separated by a gap 320. Extensions 315A and 315B parallel to longitudinal axis A-A of lower level wire 200. Vias 210A and 210B are aligned with longitudinal axis B-B of upper level wire 205. Via 210A overlaps extension 315A and via 210B overlaps extension 315B. Longitudinal axis A-A is orthogonal to longitudinal axis B-B. Extensions 315A and 315B have a width "w2" under vias 210A and 210B and vias 210A and 210B have a width "w3." Gap 320 has a width "w4." A typical overlap of a via to a side of an extension is distance "d13" while "d14" is the distance between two vias. Distance "d14" cannot be smaller than the minimum space between two vias the fabrication process is capable of producing. Distance "d13" may be zero. While two vias and two extensions have been illustrated, any number extensions may be provided and a corresponding number of vias may be laid out along longitudinal axis B-B.

Figure 11:
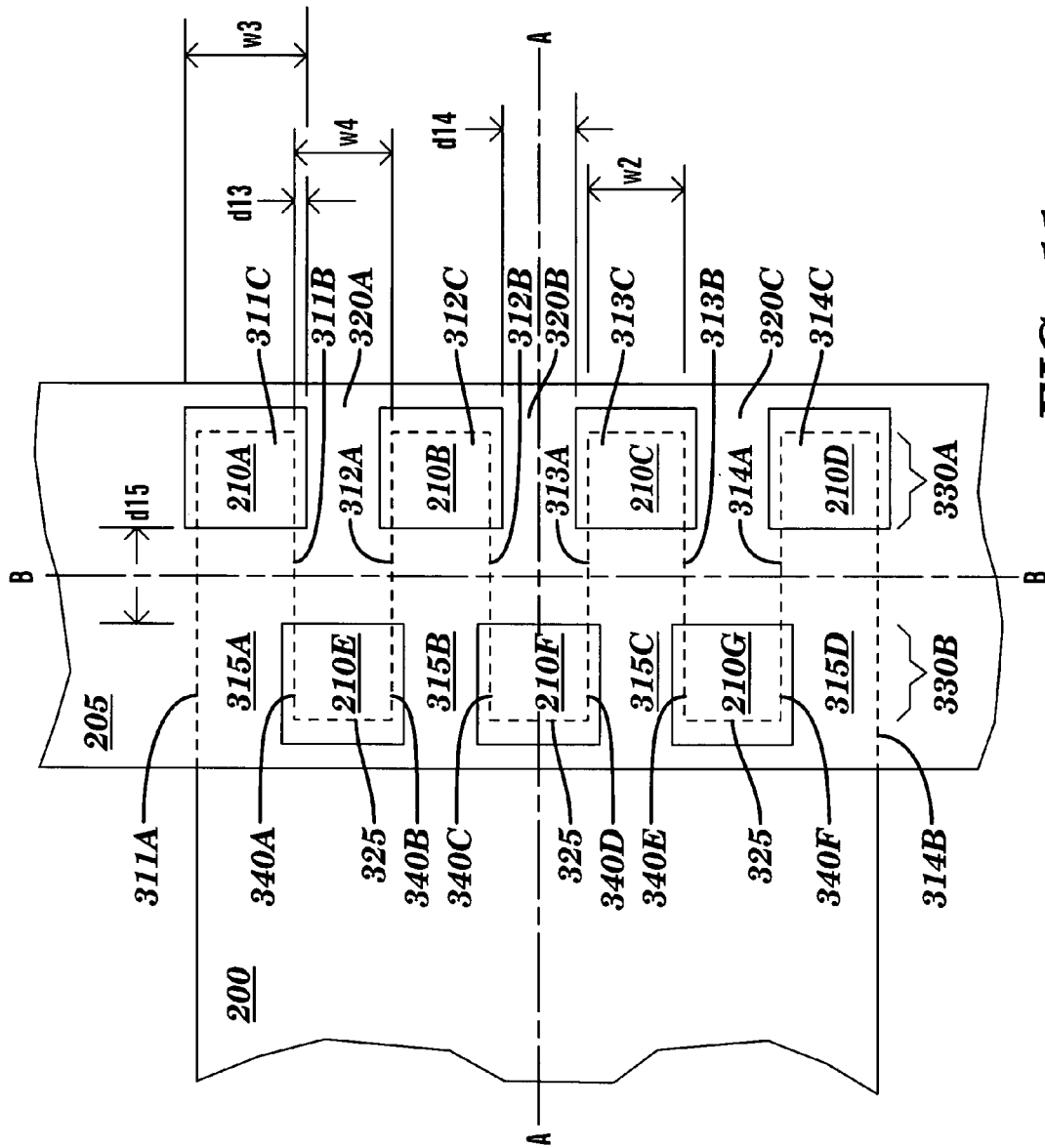

In FIG. 11, a wide lower level wire 200 is electrically connected to upper level wire 205 by a first set of vias 330A and a second set of vias 330B. Extensions 315A, 315B, 315C and 315D extend from end 325 of lower level wire 200. Extensions 315A, 315B and 315C are separated by gaps 320A, 320B and 320C. Extensions 315A, 315B, 315C and 315D extend parallel to longitudinal axis A-A of lower level wire 200. First via set 330A comprises vias 210A, 210B, 210C and 210D. Second via set 330B comprises vias 210E, 210F and 210G. Via sets 330A and 330B overlap extensions 315A, 315B, 315C and 315D. Via sets 330A and 330B are aligned with longitudinal axis B-B of upper level wire 205. Longitudinal axis A-A is orthogonal to longitudinal axis B-B.

Via 210A overlaps sides 311A and 311B and end 311C of extension 315A. Via 210B overlaps sides 312A and 312B and end 312C of extension 315B. Via 210C overlaps sides 313A and 313B and end 313C of extension 315C. Via 210D overlaps sides 314A and 314B and end 314C of extension 315D.

Via 210F overlaps sides 311B and 312A, end 325 and gap 320A. Via 210E overlaps sides 312B and 313A, end 325 and gap 320B. Via 210G overlaps sides 313B and 314A, end 325 and gap 320C.

Extensions 315A, 315B, 315C and 315D have a width "w2." Vias 210A through 210G have a width "w3." Gaps 320A, 320B and 320C have a width "w4." A typical overlap of a via to a side of an extension is distance "d13." while "d14" is the distance between vias in a via set (330A or 330B) and "d15" is the distance between vias in via sets 330A and 330B. Distances "d14" and "d15" cannot be smaller than the minimum space between two vias the fabrication process is capable of producing. Distance "d13" may be zero.

Often when current requirements would require a large via, an array of small vias is used instead. An array of small vias is better suited for photolithographic and CMP processing than a single large via. FIGS. 12 through 16 illustrate the present invention as applied to an array of vias. In FIGS. 12 through 15, an exemplary 3 by 3 array will be used. The techniques illustrated and described will work with any array dimensions.

Figure 12:
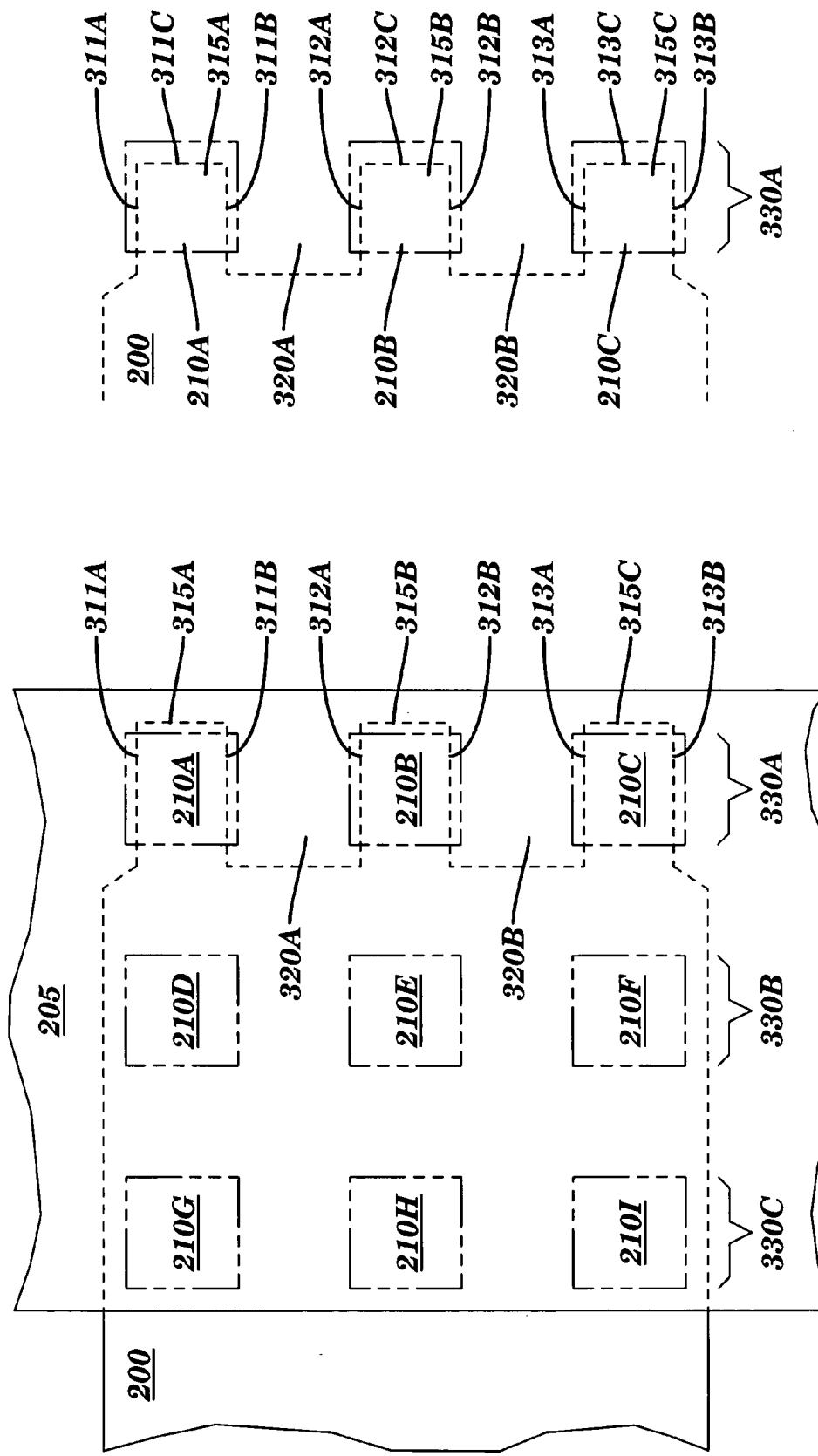

In FIG. 12, a wide lower level wire 200 is electrically connected to upper level wire 205 by first, second and third sets of vias 330A, 330B and 330C. First via set 330A comprises vias 210A, 210B and 210C. Second via set 330B comprises vias 210D, 210E and 210F. Third via set 330C comprises vias 210G, 210H and 210I. Via sets 330B and 330C contact lower level wire 200 in the conventional manner. Via set 330A overlaps extensions 315A, 315B, and 315C extending from lower level wire 200 according to the present invention. Extensions 315A, 315B and 315C are separated by gaps 320A and 320B. Via 210A overlaps sides 311A and 311B of extension 315A. Via 210B overlaps sides 312A and 312B of extension 315B. Via 210C overlaps sides 313A and 313B of extension 315C. In this configuration, even if lower level wire 200 voids under all the vias of second and third via sets 330B and 330C, the liner to liner contact of first via set 330A will ensure that an open does not occur between the lower level wire and upper level wire 205.

FIG. 12A illustrates an alternative alignment of first via set 330A of FIG. 12. In FIG. 12A, via 210A overlaps sides 311A and 311B and end 311C of extension 315A. Via 210B overlaps sides 312A and 312B and end 312C of extension 315B. Via 210C overlaps sides 313A and 313B and end 313C of extension 315C.

Figure 13:
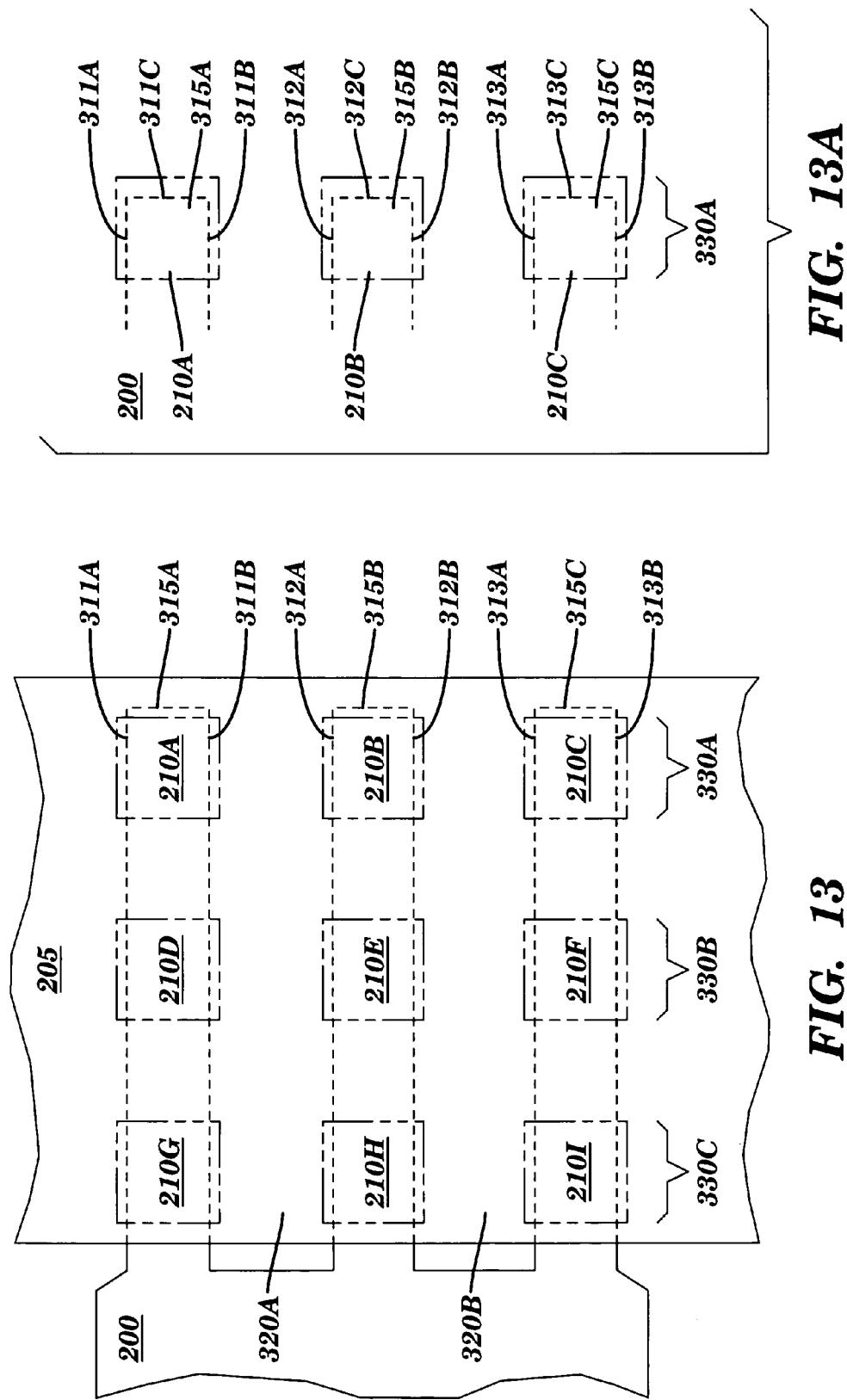

In FIG. 13, a wide lower level wire 200 is electrically connected to upper level wire 205 by first, second and third sets of vias 330A, 330B and 330C. First via set 330A comprises vias 210A, 210B and 210C. Second via set 330B comprises vias 210D, 210E and 210F. Third via set 330C comprises vias 210G, 210H and 210I. Via set 330A, 330B and 330C contact elongated extensions 315A, 315B and 315C extending from lower level wire 200. Extensions 315A, 315B and 315C are separated by gaps 320A and 320B. Vias 210A, 210D and 210G overlap extension sides 311A and 311B of extension 315A. Vias 210B, 210E and 210H overlap extension sides 312A and 312B of extension 315B. Via 210C, 210F and 210I overlap extension sides 313A and 313B of extension 315C.

FIG. 13A illustrates an alternative alignment of first via set 330A of FIG. 13. In FIG. 13A, via 210A additionally overlaps end 311C of extension 315A. Via 210B, additionally overlaps end 312C of extension 315B. Via 210C, additionally overlaps end 313C of extension 315C.

Figure 14:
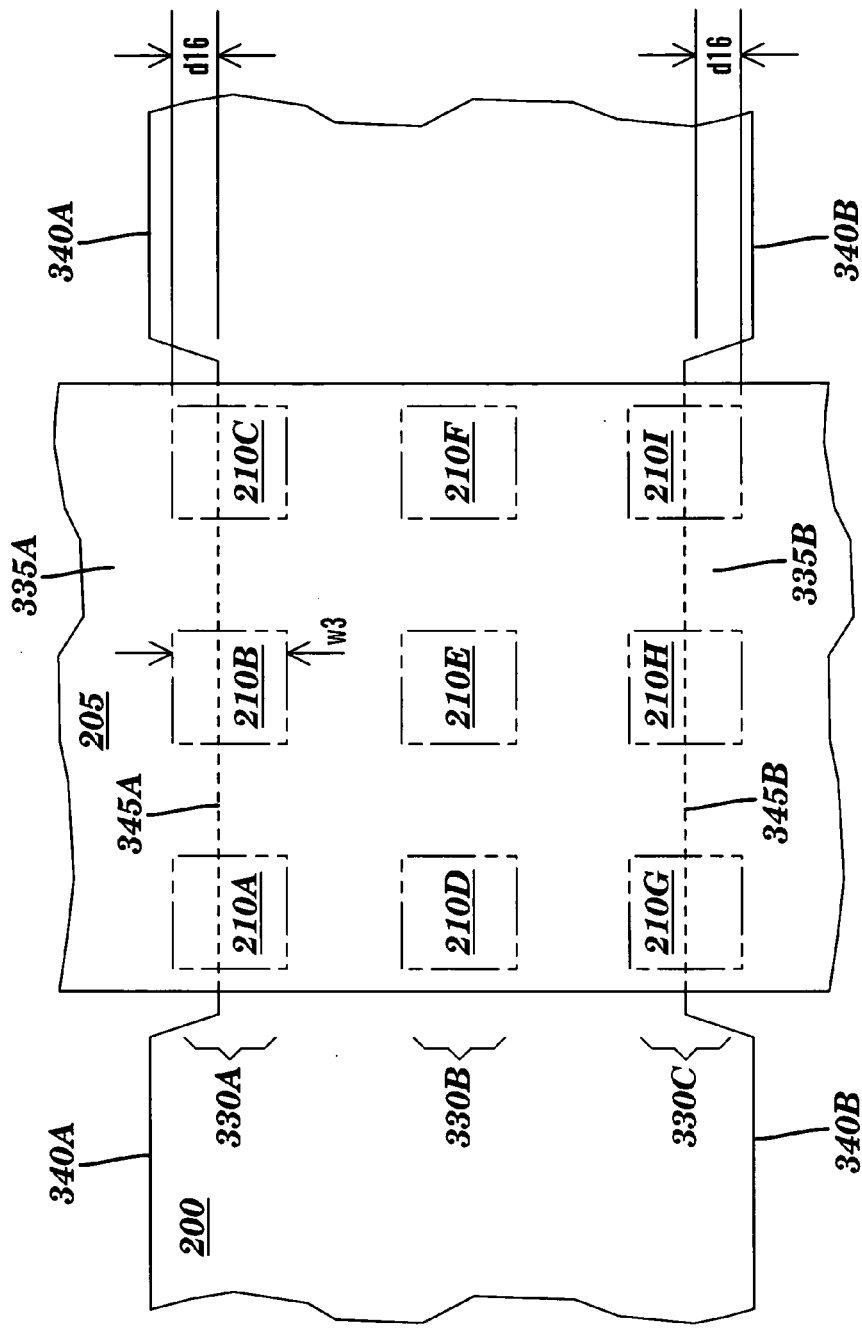
Figure 15:
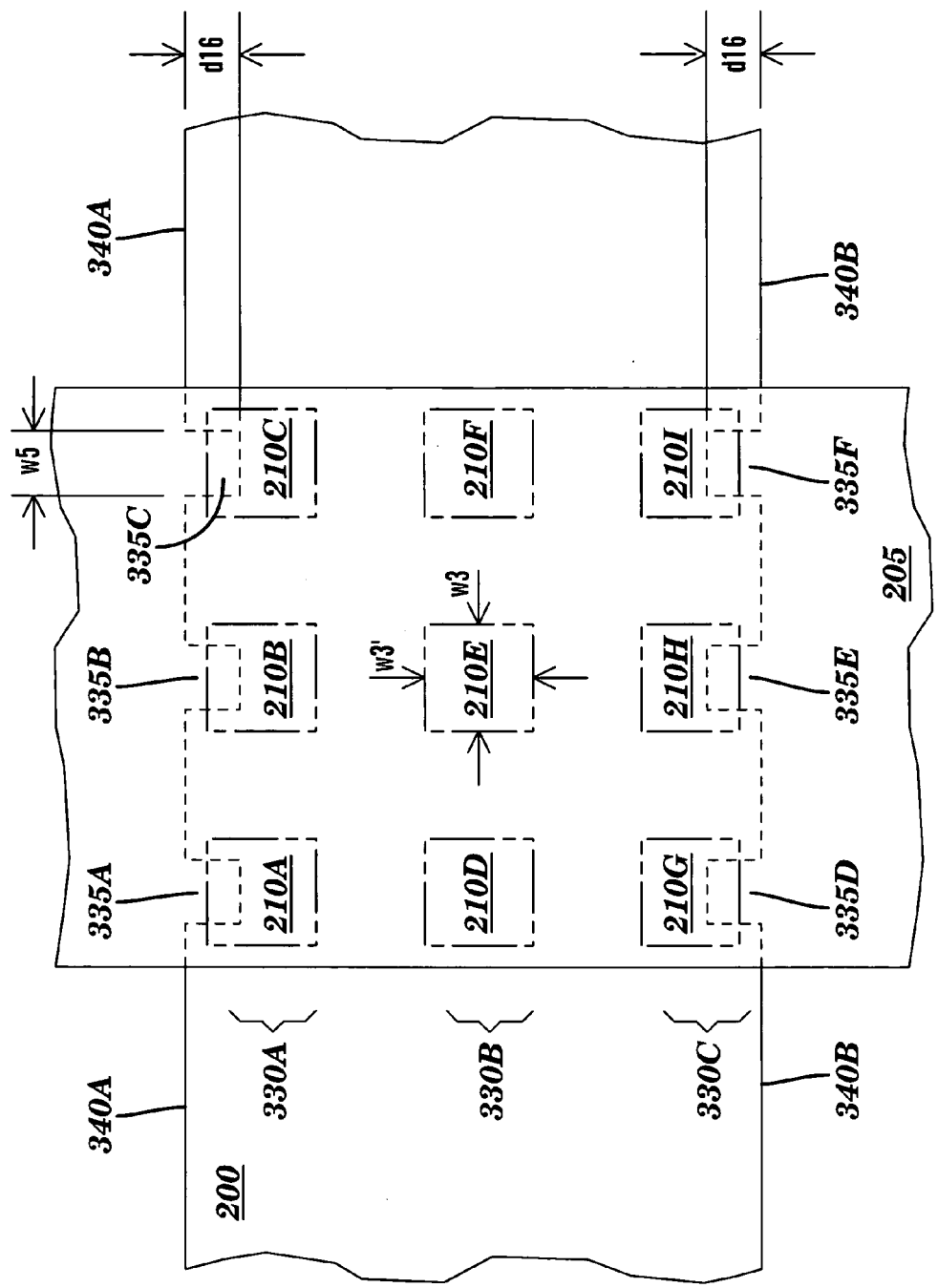
Figure 16:
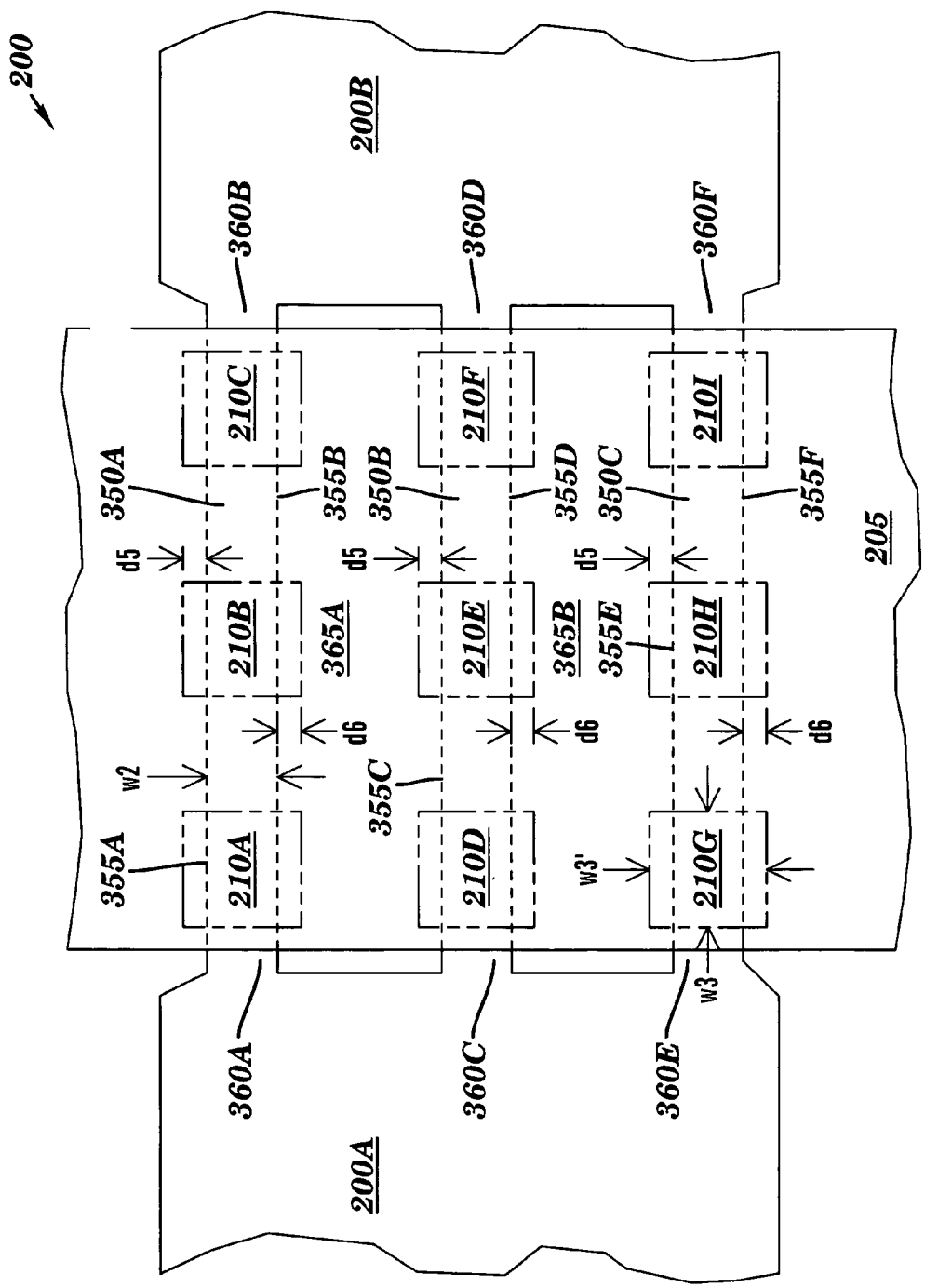

The previous description of the present invention has been illustrated in cases where vias have been connecting an upper level wire to an end of a lower level wire. FIGS. 14 through 16 illustrate the present invention as applied to connecting an upper level wire to a lower level wire away from an end of the lower level wire. In FIGS. 14 through 16, an exemplary 3 by 3 array between two wide wires will be used. The techniques illustrated and described will work with any array dimensions.

In FIG. 14, a wide lower level wire 200 is electrically connected to upper level wire 205 by a first set of vias 330A, a second set of vias 330B and a third set of vias 330C. All vias are "w3'" in length. Elongated notches 335A and 335B are formed in sides 340A and 340B, respectively of lower level wire 200. First via set 330A comprises vias 210A, 210B, and 210C. Second via set 330B comprises vias 210D, 210E and 210F. Third via set 330C comprises vias 210G, 210H and 210I. Vias 210A, 210B and 210C overlap a notch edge 345A a distance "d16" and vias 210G, 210H and 210I overlap a notch edge 345B a distance "d16" as well. Vias 210D, 210E and 210F contact lower level wire 200 in the conventional manner. Distance "d16" can be a small as zero but no greater than "w3'." In one example, "d16" is about 0.2 to 0.35 micron when "w3'" is 0.4 micron.

In FIG. 15, a wide lower level wire 200 is electrically connected to upper level wire 205 by a first set of vias 330A, a second set of vias 330B and a third set of vias 330C. All vias are "w3" wide by "w3'" in length. Individual notches 335A, 335B and 335C are formed in sides 340A of lower level wire 200. Individual notches 335D, 335E and 335F are formed in side 340B of lower level wire 200. First via set 330A comprises vias 210A, 210B, and 210C. Second via set 330B comprises vias 210D, 210E and 210F. Third via set 330C comprises vias 210G, 210H and 210I. Notch 335A extends under via 210A a distance "d16." Notch 335B extends under via 210B a distance "d16." Notch 335C extends under via 210C a distance "d16." Notch 335D extends under via 210G a distance "d16." Notch 335E extends under via 210H a distance "d16." Notch 335F extends under via 210I a distance "d16." Vias 210D, 210E and 210F contact lower level wire 200 in the conventional manner. Distance "d16" can be a small as zero but no greater than "w3'." Notches 335A through 335F are "w5" wide. In the example illustrated in FIG. 15, "w5" is less than "w3," however "w5" may be equal to or greater than "w3."

In FIG. 16, a wide lower level wire 200 is comprised of a first wire segment 200A connected to a second wire segment 200B by interior wire segments 350A, 350B and 350C. Wire segment 350A has sides 355A and 355B and ends 360A and 360B. Wire segment 350A is connected to first wire portion 200A at end 360A and is connected to second wire portion 200B at end 360B. Wire segment 350B has sides 355C and 355D and ends 360C and 360B. Wire segment 350B is connected to first wire portion 200A at end 360C and is connected to second wire portion 200B at end 360D. Wire segment 350C has sides 355E and 355F and ends 360E and 360F. Wire segment 350C is connected to first wire portion 200A at end 360E and is connected to second wire portion 200B at end 360F. Upper level wire 205 is electrically connected to first wire segment 350A by vias 210A, 210B and 210C. Upper level wire 205 is electrically connected to second wire segment 350B by vias 210D, 210E and 210F. Upper level wire 205 is electrically connected to third wire segment 350C by vias 210G, 210H and 210I. First and second wire segments 350A and 350B are separated by a first gap 365A. Second and third wire segments 350B and 350C are separated by a second gap 365B. Vias 210A, 210B and 210C overlap sides 355A and 355B of first line segment 350A by "d5" and "d6" respectively. Vias 210D, 210E and 210F overlap sides 355C and 355D of second line segment 350B by "d5" and "d6" respectively. Vias 210G, 210H and 210I overlap sides 355E and 355F of third line segment 350C by "d5" and "d6" respectively. All vias are "w3" wide by "w3'" in length. Wire segments 350A, 350B and 350C are "w2" wide. By construction, w3=w2+d6+d7.

Figure 17:
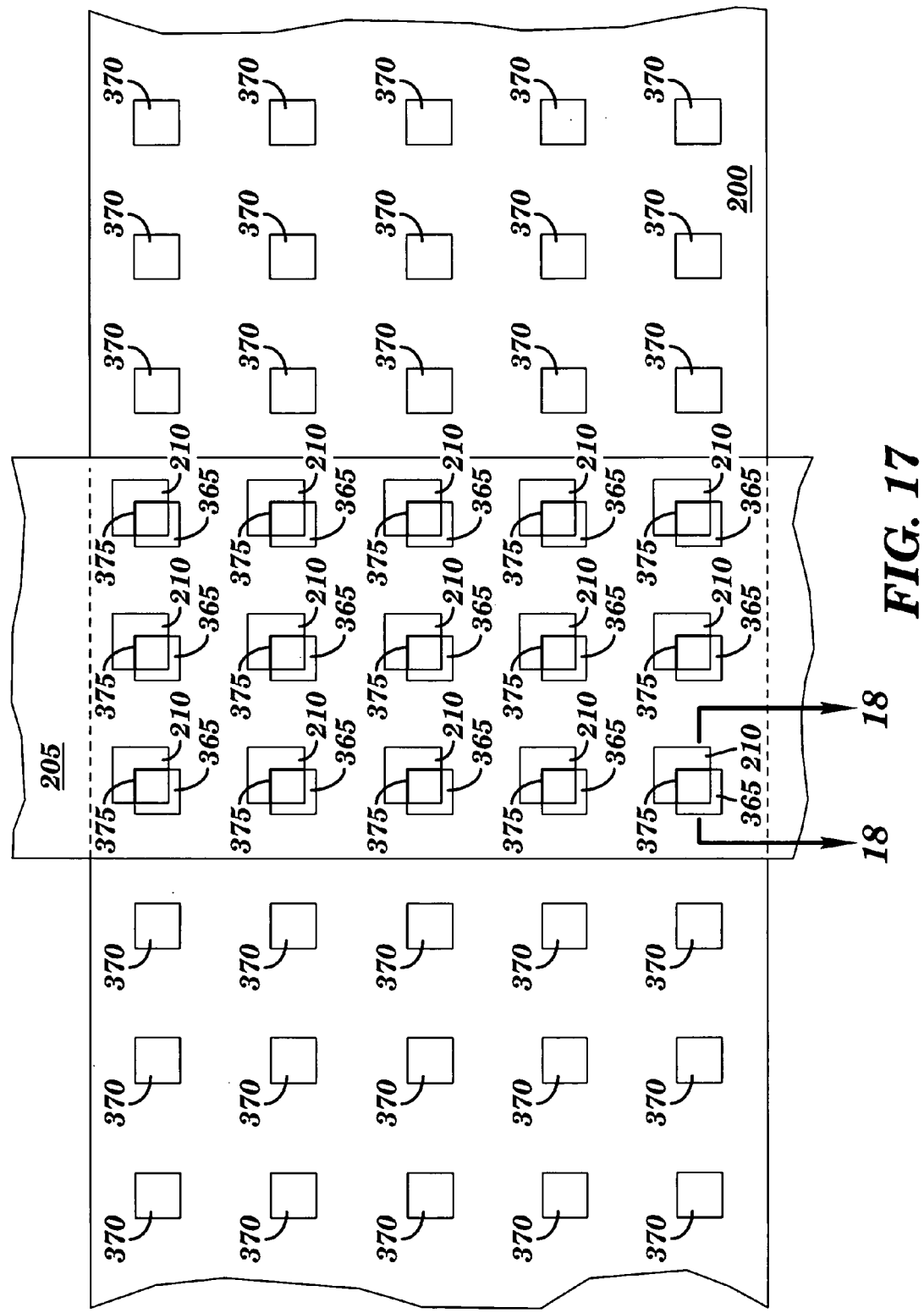
FIG. 17 is a partial top view of the present invention employing CMP fill shapes.
Figure 18:
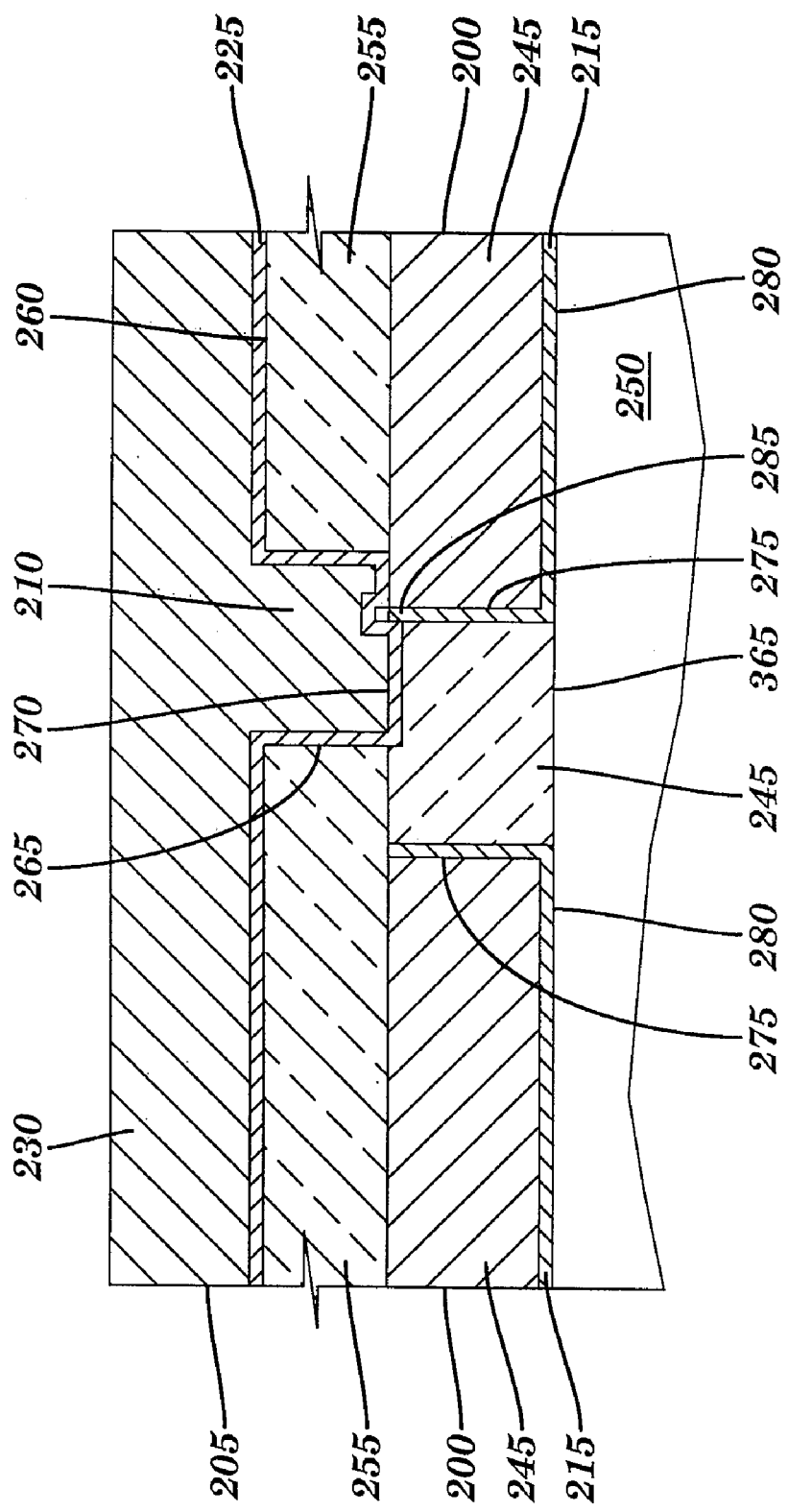
FIG. 18 is a partial cross-section view through 18-18 of FIG. 17.

FIG. 17 is a partial top view of the present invention employing CMP fill shapes. In FIG. 17, a wide lower level wire 200 is connected to upper level wire 205 by a multiplicity of vias 210. Lower level wire 200 includes a multiplicity of dielectric pillars 365 and a multiplicity of dielectric pillars 370. Each dielectric pillar 365 and 370 is filled with dielectric material as illustrated in FIG. 18 and described below. Dielectric pillars 365 are positioned under upper level wire 205, while dielectric pillars 370 are not. Dielectric pillars 365 and 370 are placed in lower level wire 205 to prevent dishing during CMP processes. Dishing is where, in very wide metal lines, the metal thickness decreases from the edge of the wire to the center of the wire. Instead of placing vias to avoid the dielectric pillars, the present invention places the vias to overlap the dielectric pillars in order to create a multiplicity of liner-to-liner contact regions 375.

FIG. 18 is a partial cross-section view through 18-18 of FIG. 17. In FIG. 18, a lower dielectric layer 245 is formed on a semiconductor substrate 250. Lower wire 200 is formed in lower dielectric layer 245. Formed on top of a lower dielectric layer 245 and lower wire 200 is an upper dielectric layer 255. Upper wire 205 and via 210 are formed in an upper dielectric layer 255. Conductive liner 225 covers a bottom 260 of upper wire 205 and sidewall 265 and a bottom 270 of via 210. Conductive liner 215 covers a sidewall 275 and a bottom 280 of lower wire 200. Conductive liner 225, of upper level wire 205, also covers and upper edges 285 of conductive liner 215 of lower wire 210. Bottom of via 210 overlaps dielectric pillar 365 as well as lower dielectric layer 245.

Figure 19:
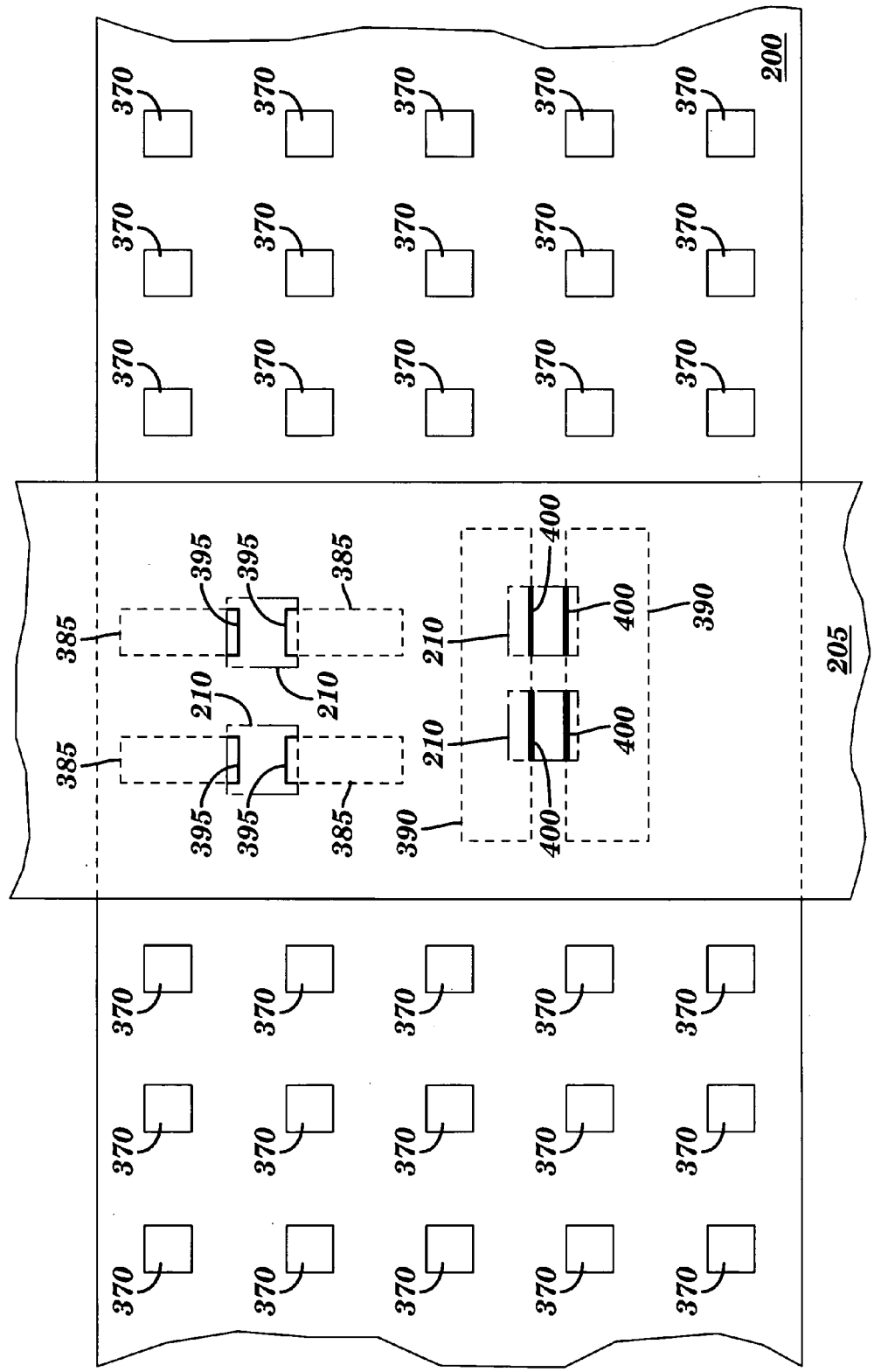
FIG. 19 is a partial top view of alternative via to CMP fill shape layouts.

FIG. 19 is a partial top view of alternative via to CMP fill shape layouts. In FIG. 19, a wide lower level wire 200 is connected to upper level wire 205 by a multiplicity of vias 210. Lower level wire 200 includes a multiplicity of dielectric pillars 370, a multiplicity of dielectric pillars 385 and a multiplicity of dielectric pillars 390. Each dielectric pillar 370, 385 and 390 is filled with dielectric material as illustrated in FIG. 18 and described above. Dielectric pillars 385 and 390 are positioned under upper level wire 205, while dielectric pillars 370 are not. The overlap of vias 210 with dielectric pillars 385 forms liner-to-liner contact regions 395. The overlap of vias 210 with dielectric pillars 390 forms liner-to-liner contact regions 400. Dielectric pillars 385 and 390 differ from dielectric pillars 370 in that the size, shape and location of the pillars have been modified so that the dielectric pillars align under vias 210.

Figure 20B:
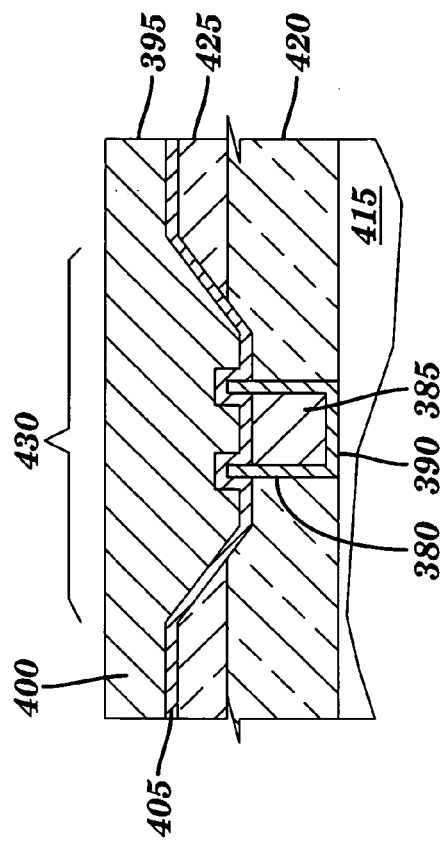
FIGS. 20A through 20D illustrate a first alternative method of contacting two lines according to the present invention.
Figure 20D:
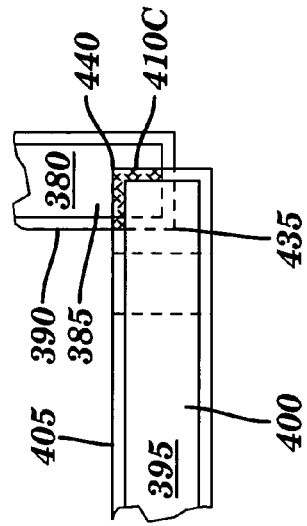
Figure 20A:
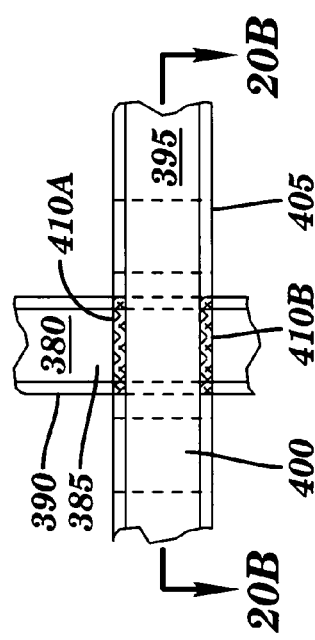

FIGS. 20A through 20D illustrate a first alternative method of contacting two lines according to the present invention. In FIG. 20A, a lower wire 380 comprises a core conductor 385 and a conductive liner 390. An upper wire 395 comprises a core conductor 400 and a conductive liner 405. Where conductive liner 390 of lower wire 380 contacts conductive liner 405 of upper wire 395, a liner-to-liner contact regions 410A and 410B are defined. Materials for conductive liners and core conductors are the same as described above. Upper wire 395 may be formed by a damascene process while lower wire 380 may be formed by either a damascene or dual damascene process.

FIG. 20B is a partial cross-sectional view through line 20B-21B of FIG. 20A. In FIG. 20B, formed on a substrate 415 is a lower dielectric layer 420. Lower wire 380 has been formed in lower dielectric layer 420. Formed on top of lower dielectric layer 420 is upper dielectric layer 425. Upper wire 400 has been formed in an upper dielectric layer not visible in FIG. 21B.

Figure 20C:
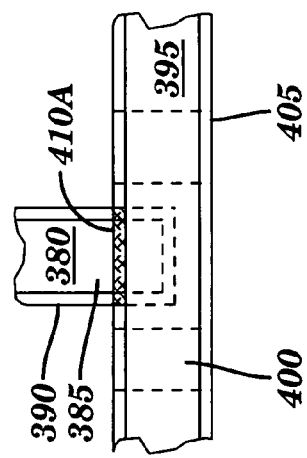

In FIG. 20C, lower wire 380 does not extend entirely under upper wire 445. Therefore only one contact-to-contact region, contact-to contact-region 460A, is defined.

In FIG. 20D, only a corner region 435 of lower wire 380 extends under a corner region 440 of upper wire 395 defining an "L" shaped contact-to-contact region 410C.

Figure 21B:
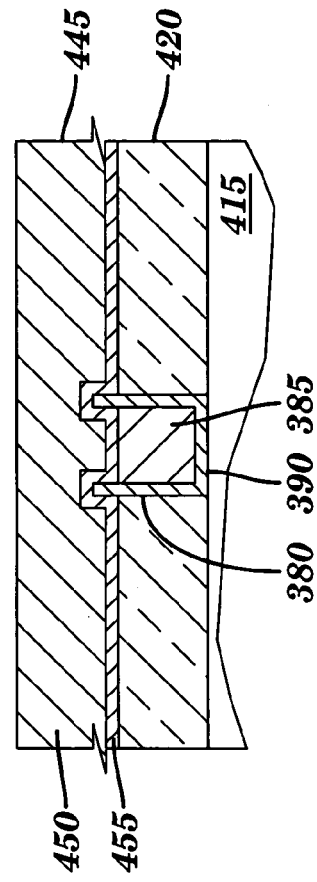
FIGS. 21A through 21D illustrate a second alternative method of contacting two lines according to the present invention.
Figure 21D:
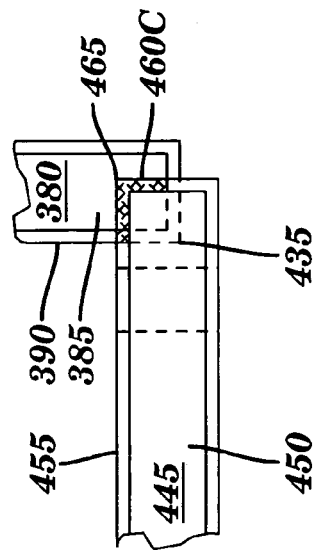
Figure 21A:
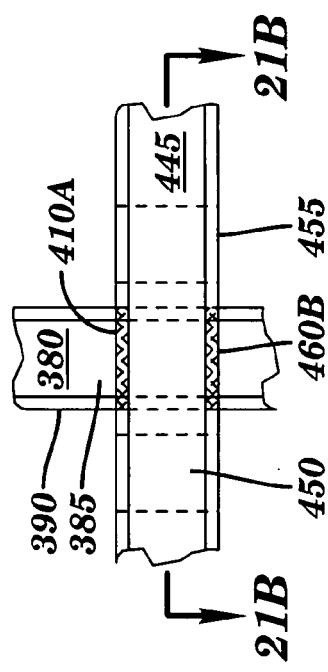

FIGS. 21A through 21D illustrate a second alternative method of contacting two lines according to the present invention. In FIG. 21A, a lower wire 380 comprises a core conductor 385 and a conductive liner 390. An upper wire 445 comprises a core conductor 450 and a conductive liner 455. Where conductive liner 390 of lower wire 380 contacts conductive liner 455 of upper wire 445, a liner-to-liner contact regions 460A and 460B are defined. Materials for conductive liners and core conductors are the same as described above. Upper wire 445 may be formed by a damascene process while lower wire 380 may be formed by either a damascene or dual damascene process.

FIG. 21B is a partial cross-sectional view through line 21B-21B of FIG. 21A. In FIG. 21B, formed on a substrate 415 is a lower dielectric layer 420. Lower wire 380 has been formed in lower dielectric layer 420. Upper wire 445 has been formed in upper dielectric layer 425. A notable feature of upper wire 395 is an integral bar via region 430 formed therein. Bar via region along the longitudinal axis of line upper wire 395 and contacts lower wire 380.

Figure 21C:
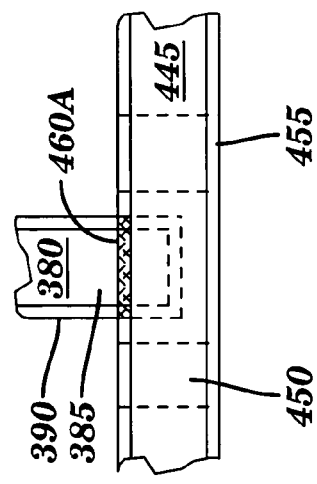

In FIG. 21C, lower wire 380 does not extend entirely under upper wire 395. Therefore only one contact-to-contact region, contact-to contact-region 410A, is defined.

In FIG. 21D, only a corner region 435 of lower wire extends under a corner region 465 of upper wire 445 defining an "L" shaped contact-to-contact region 460C.

The description of the embodiments of the present invention is given above for the understanding of the present invention. It will be understood that the invention is not to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An interconnect structure, comprising:
a lower level wire having a side and a bottom, said lower level wire comprising a lower core conductor and a lower conductive liner, said lower conductive liner on the side and the bottom of said lower level wire;
one or more dielectric pillars formed in said lower level wire, said lower conductive liner on sides of said dielectric pillars;
an upper level wire having a side and a bottom, said upper level wire comprising an upper core conductor and an upper conductive liner, said upper conductive liner on the side and the bottom of said upper level wire; and
said upper conductive liner in contact with said lower core conductor and also in contact with said lower conductive liner on the sides of said dielectric pillars in liner-to-liner contact regions.

2. An interconnect structure, comprising:
a lower level wire having a side and a bottom, said lower level wire comprising a lower core conductor and an lower conductive liner, said lower conductive liner on the side and the bottom of said lower level wire;
one or more dielectric pillars formed in said lower level wire, said lower conductive liner on sides of said dielectric pillars;
an upper level wire having a side and a bottom and one or more vias integrally formed in the bottom of said upper level wire, each via having a side and a bottom, said upper level wire and each via comprising an upper core conductor and an upper conductive liner, said upper conductive liner on the side and the bottom of said upper level wire and on the side and bottom of each via; and
said upper conductive liner on the bottom of at least a portion of said one or more vias in contact with said lower core conductor and at least a portion of said one or more vias in contact with said lower conductive liner on said side of at least a portion of said one or more dielectric pillars in liner-to-liner contact regions.

3. The interconnect structure of claim 2, wherein said lower conductive liner on the side of said one or more dielectric pillars includes an upper edge having an inner surface, an outer surface, and a top surface and said upper conductive liner on the bottom of vias of said second portion of said array of vias contact one or more of said inner, outer and top surfaces to form said liner-to-liner contact region.

4. The interconnect structure of claim 2, wherein said liner-to liner contact region comprises first portions co-extensive with said lower conductive liner on portions of first sides of said dielectric pillars under said vias.

5. The interconnect structure of claim 4, wherein said liner-to liner contact region further comprises second portions co-extensive with said lower conductive liner on portions of second sides of said dielectric pillars under said vias.

6. The interconnect structure of claim 5, wherein said liner-to-liner contact region further comprises a third portion co-extensive with said lower conductive liner on portions of third sides of said dielectric pillars under said vias.

* * * * *